United States Patent
O'Daniel et al.

(10) Patent No.: US 11,396,994 B1
(45) Date of Patent: Jul. 26, 2022

(54) LASER LIGHT SOURCE HAVING DIFFUSER ELEMENT AND LIGHT DIVERGING OPTIC

(71) Applicant: II-VI Delaware, Inc., Wilmington, DE (US)

(72) Inventors: Jason O'Daniel, Gunter, TX (US); Francesco Schiattone, San Jose, CA (US); Pei-Song Cai, Taoyuan (TW)

(73) Assignee: II-VI Delaware, Inc., Wilmington, DE (US)

( * ) Notice: Subject to any disclaimer, the term of this patent is extended or adjusted under 35 U.S.C. 154(b) by 0 days.

(21) Appl. No.: 17/176,333

(22) Filed: Feb. 16, 2021

(51) Int. Cl.
*F21V 5/04* (2006.01)
*G02B 27/09* (2006.01)

(52) U.S. Cl.
CPC .......... *F21V 5/048* (2013.01); *G02B 27/0955* (2013.01)

(58) Field of Classification Search
CPC . F21V 5/048; F21V 5/04; F21V 13/02; F21Y 2115/30; H04B 10/503
See application file for complete search history.

(56) References Cited

U.S. PATENT DOCUMENTS

| | | | |
|---|---|---|---|
| 1,297,040 A * | 3/1919 | Trapp | G02B 3/04 359/712 |
| 5,535,230 A * | 7/1996 | Abe | F21K 9/69 372/50.23 |
| 6,520,670 B2 * | 2/2003 | Liang | H01L 33/58 362/555 |
| 8,641,238 B2 * | 2/2014 | Chiu | F21K 9/66 362/335 |
| 8,743,923 B2 | 6/2014 | Geske et al. | |
| 10,072,815 B2 | 9/2018 | MacKinnon et al. | |
| 10,705,347 B2 | 7/2020 | Chen et al. | |
| 10,823,365 B2 | 11/2020 | Gray et al. | |
| 10,838,217 B2 | 11/2020 | Gurgov | |
| 2015/0301235 A1 | 10/2015 | Mikhailov et al. | |
| 2016/0116750 A1 | 4/2016 | Mitra | |
| 2016/0182788 A1 | 6/2016 | Wan et al. | |
| 2016/0230954 A1 * | 8/2016 | Ha | G02B 19/0061 |
| 2017/0351110 A1 | 12/2017 | Gurgov | |
| 2017/0374244 A1 | 12/2017 | Swaminathan et al. | |
| 2018/0131450 A1 | 5/2018 | Kare et al. | |
| 2019/0187341 A1 | 6/2019 | Chakmakjian et al. | |
| 2019/0268068 A1 | 8/2019 | Dacha et al. | |
| 2019/0293843 A1 | 9/2019 | Ripoli et al. | |
| 2019/0302596 A1 | 10/2019 | Shulepova et al. | |
| 2019/0346687 A1 | 11/2019 | Zheng | |

(Continued)

FOREIGN PATENT DOCUMENTS

| CN | 111928145 A * | 11/2020 | ............ F21S 8/00 |
|---|---|---|---|
| DE | 19919144 A1 * | 6/2001 | ............ G02B 3/06 |

(Continued)

*Primary Examiner* — Ismael Negron
(74) *Attorney, Agent, or Firm* — Wendy W. Koba

(57) ABSTRACT

An illumination device includes a laser source, a conventional diffuser element, and an extender optic with a curved interior surface and a curved exterior surface. Light emitted by the laser source with a given field of illumination (FOI) is received by the conventional diffuser element and outputted towards the interior surface of the extender optic with an increased FOI; the exterior surface of the extender optic then outputs the light received by the interior surface as light with an even greater FOI, usually in the range of 120°-185°.

18 Claims, 4 Drawing Sheets

(56) References Cited

U.S. PATENT DOCUMENTS

2020/0192106 A1\*  6/2020  Short ................... H01S 3/1611
2020/0310005 A1  10/2020  Carson et al.

FOREIGN PATENT DOCUMENTS

| EP | 2112424 A1 \* | 10/2009 | .............. F21V 5/008 |
| WO | WO 2009/153446 | 12/2009 | |
| WO | WO-2009153446 A2 \* | 12/2009 | ......... G02B 27/4272 |
| WO | WO 2020/030916 | 2/2020 | |

\* cited by examiner

LASER LIGHT SOURCE HAVING DIFFUSER ELEMENT AND LIGHT DIVERGING OPTIC

TECHNICAL FIELD

The present invention relates to light sources useful in 3D sensing applications and, more particularly to a light source with a wide field of illumination (FOI) that is well-suited for use as a flood illuminator.

BACKGROUND DISCUSSION

In applications related to three-dimensional (3D) imaging and sensing, optical components are typically used to project a pattern of light over a scene being analyzed. Lasers operating over a wavelength range between about 800-1000 nm are useful for this type of analysis. In particular, arrays of vertical cavity surface emitting lasers (VCSELs) are a convenient light source, since the emission is through a top (or bottom) surface of an array substrate. The particular light pattern depends upon the technology associated with the type of analysis being performed and can take on various structures including, but not limited to, flood illumination, a periodic grid of spots, lines, stripes, checkerboard, and the like.

While VCSEL arrays operate within a wavelength range convenient for these sensing applications and can easily be formed in a two-dimensional array configuration, the individual beams (which exit along an optical axis perpendicular to the array surface) exhibit a narrow mode field diameter and cannot provide the desired type of structured light output without additional beam shaping optics.

Prior art arrangements address this problem by including a diffuser with the VCSEL array. The individual light beams from each emitter region in the VCSEL array pass through the diffuser and are refracted to provide an output light pattern with a somewhat larger FOI (typically in the range of 35-120° along a particular dimension). These FOI patterns are typically rectangular in shape to match the field of view (FOV) of the imaging sensor.

For some flood illuminator applications where a wide FOV is desired, an FOI of at least 120° (but typically closer to 160°) is preferred, so that a single illumination source can illuminate an entire scene to be captured by an associated imaging sensor. Specialty diffusers, formed of expensive glass materials with high refractive index values, have been able to approach this wider FOI, but at a significant cost.

SUMMARY OF THE INVENTION

The need remaining in the prior art is addressed by the present invention, which relates to light sources useful in 3D sensing applications and, more particularly to a light source with a wide field of illumination (FOI) that is well-suited for use as a flood illuminator.

In accordance with the principles of the present invention, a light source is formed to use an extender optic component in combination with a conventional diffuser, where the combination may yield an FOI in a given direction that ranges from 120-185° (160° being a typical value) at a relatively low cost and with minimal changes to the assembly. The extender optic component (which may be formed of an optical plastic material) exhibits a dome-like outer surface, with an internal central region of curvature. Placing the extender optic component directly over the diffuser has been found to achieve the desired FOI.

An exemplary embodiment of the present invention may take the form of a wide field of illumination (FOI) light source based upon a combination of a laser source for generating an initial light beam, a diffuser element disposed over the laser source, and an extender optic positioned over the diffuser element. The diffuser element interacts with the initial light beam produced by the laser source to shaped light beam with a somewhat expanded. The extender optic is configured to include an interior curved surface for receiving the shaped light beam from the diffuser element and an exterior curved surface for further refracting the shaped light beam, creating as an output a light beam with an FOI wider than the expanded FOI provided by the diffuser element.

The input laser source may take the form of a single laser device (edge-emitting or VCSEL), a fiber-based laser source, or an array of such devices (one-dimensional or two-dimensional). The interior and exterior curved surfaces of the extender optic may be spherical in form (extending beam along orthogonal axes), cylindrical in form (confining extension of the FOI along a single axis), or of any aspheric topology as required for a specific application.

Other and further aspects and embodiments of the present invention will become apparent during the course of the following discussion and by reference to the accompanying drawings.

BRIEF DESCRIPTION OF THE DRAWINGS

Referring now to the drawings, where like numerals represent like parts in several views:

FIG. 6(a) is a diagram of the radial intensity of an output beam from a prior art diffuser and FIG. 6(b) is a diagram of the radial intensity of an output beam from the inventive light source, clearly showing an increase in the FOI.

DETAILED DESCRIPTION

Figure 1:
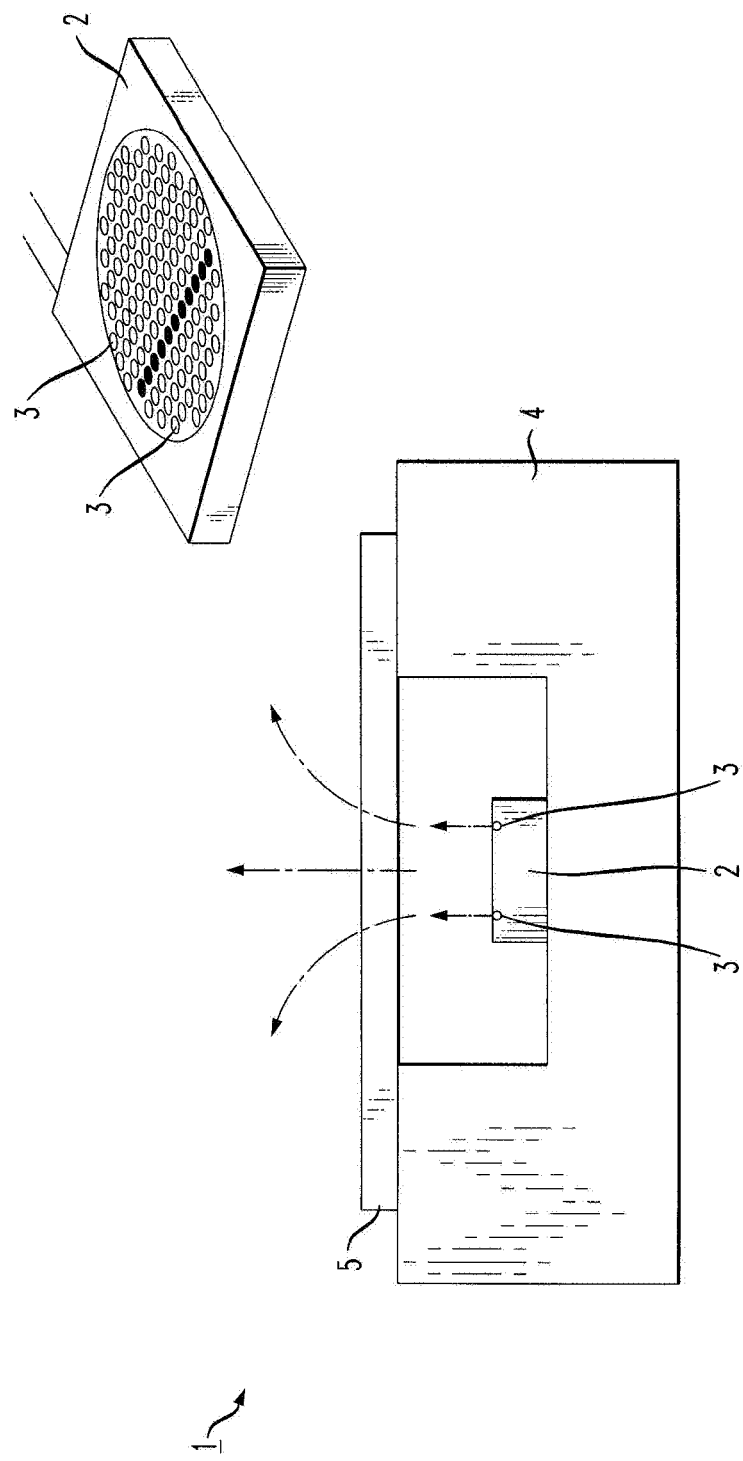
FIG. 1 is a simplified diagram of a prior art flood illuminator.
Figure 2:
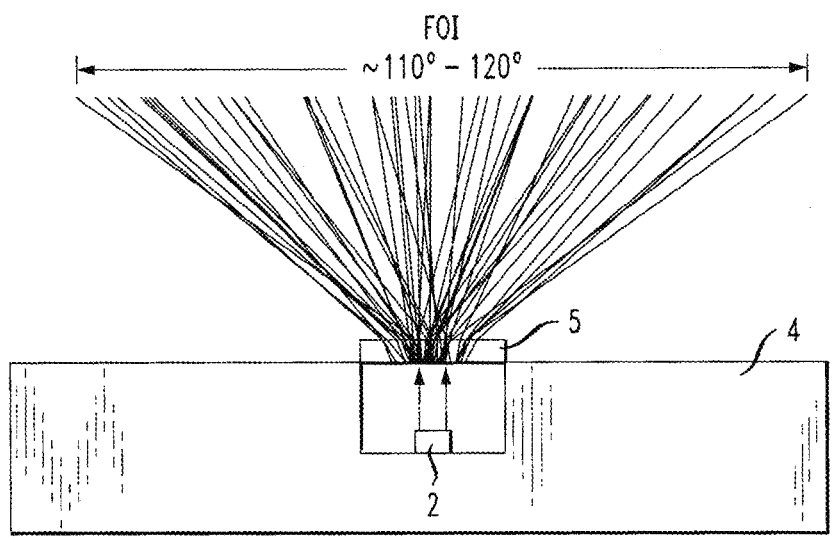
FIG. 2 is a ray tracing depicting a typical FOI (on the order of about) 110° created by using a diffuser element as shown in the prior art device of FIG. 1.

FIG. 1 is a simplified side view of a typical prior art flood illuminator 1, based on a VCSEL light source 2 comprising a plurality of individual VCSEL emitters 3 arranged in this example as a two-dimensional array pattern (the array structure shown in the inset of FIG. 1, where a specific "line" in the array pattern, shown as shaded emitters is defined as a one-dimensional array pattern and may be used in this form). VCSEL light source 2 is positioned within a package housing 4, as shown, and disposed so that when energized the array of light beams will be directed upward and away from package housing 4. A diffuser 5 is shown as positioned above VCSEL light source 2, where it functions in a manner discussed above to somewhat spread the plurality of light beams as they are directed toward an object being imaged/sensed. FIG. 2 depicts a ray tracing of the output from including diffuser 5 with VCSEL light source 2, providing a FOI that is typically in the range of 110-120°. It is to be understood that the "emitters" as shown in the set of FIG. 1 may also comprise a plurality of edge-emitting light sources, and may also be used as a single emitter source, a one-dimensional array source, or a two-dimensional array source.

Figure 3:
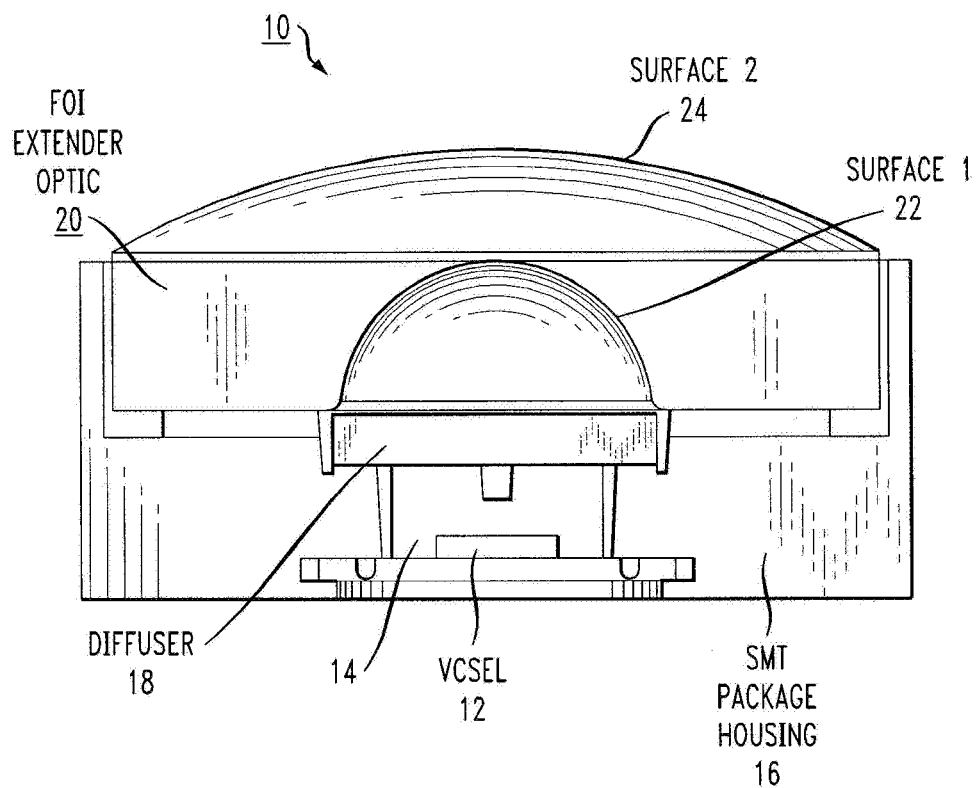
FIG. 3 is an isometric view of an exemplary flood illuminator light source formed in accordance with the present invention to utilize an extender optic in combination with the conventional diffuser to increase the FOI of the source.

A flood illuminator light source 10 formed in accordance with the principles of the present invention is shown in a cut-away view in FIG. 3. Similar to the prior art arrangement of FIG. 1, this particular embodiment of the present invention is based upon the use of a light-emitting array 12, positioned as shown within a central cavity region 14 of a housing 16. As shown in the inset of FIG. 3, light-emitting array 12 comprises a plurality of individual light emitters 13 (which may be individual edge-emitting lasers or VCSELs). Light-emitting array 12 may be utilized as a two-dimensional array or a one-dimensional array (the latter alternative if the "line" of shaded emitters 13 is energized for use). A diffuser 18 (which may comprise a conventional, low-cost element) is positioned above light-emitting array 12 so as to intercept the plurality of individual beams that are emitted when the array is energized. The inclusion of diffuser 18 functions to spread the output illumination from light-emitting array 12 over a somewhat expanded FOI, as shown in the prior art of FIG. 2, with the output illumination exhibiting an FOI in the range of about 110-120°.

In accordance with the teachings of the present invention, an extender optic 20 is positioned over diffuser 18 and functions to widen the FOI of light-emitting array 12 from this initial value of 110-120° to that desired for 3D sensing applications, for example, in the range of 150-160°, and higher. Extender optic 20 is a solid member including an interior curved surface 22 and an outer curved surface 24. Preferably, diffuser 18 is sized to match the diameter D of interior curved surface 22 to minimize refraction at this interface. The curvature of outer surface 24 is chosen to provide the desired angular magnification, while minimizing Fresnel losses at the interface. If the curvature of outer surface 24 is too small, there could be a significant amount of unwanted total internal reflections for light at the higher angles.

Figure 4:
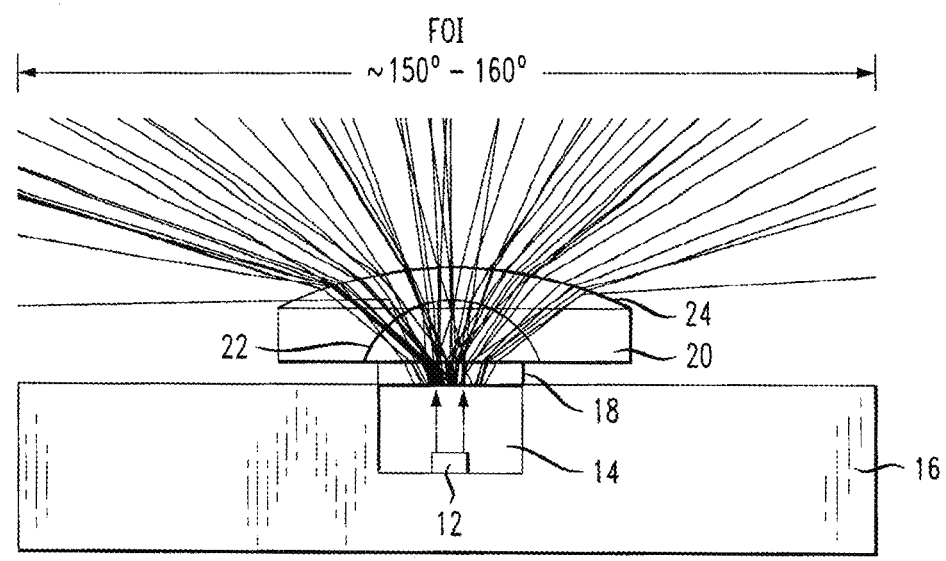
FIG. 4 is a tray tracing depicting the improvement in FOI provided by including the extender optic in the manner shown in FIG. 3.

FIG. 4 depicts a ray tracing of the output from using the combination of diffuser 18 and extender optic 20 as shown in FIG. 3, illustrating a much-expanded FOI when compared to the ray tracing of FIG. 2. In this case, interior curved surface 22 and outer curved surface 24 are both spherical in form, where the use of a spherical surface is preferred for applications where it is desired to expand the FOI along orthogonal axes (sometimes referred to as "vertical" and "horizontal", as mentioned below).

The use of spherical surfaces should be considered as only one possibility. For example, surfaces 22 and 24 may be formed to exhibit a cylindrical topology, useful in extending the FOI along only one axial direction. In this case, it is possible to form a light source where diffuser 18 expands the FOI in two dimensions, with the cylindrical geometry of extender optic 20 widening the FOI in only one dimension, with FOI provided by diffuser 18 in the orthogonal direction being unchanged. Alternatively, these surfaces may be aspheric, or any free-form topology as required to provide further degrees of freedom to reshape the power distribution exiting diffuser 18.

Figure 5:
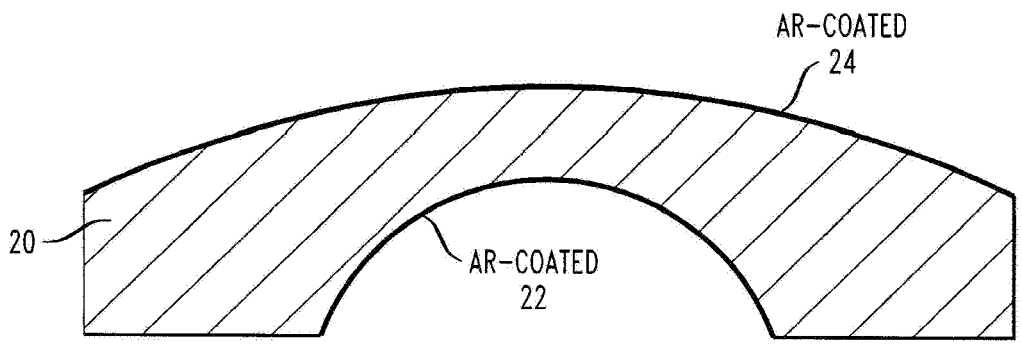
FIG. 5 is a side view of an exemplary extender optic, illustrating both the interior curved surface and the exterior curved surface.

FIG. 5 is a side view of extender optic 20. Extender optic 20 may be formed of an optical plastic material that is transparent at the operating wavelength of interest. Advantageously, this type of extender optic 20 may be formed using any well-known plastic fabrication technique (molding, 3D printing, or the like), allowing for the increase in FOI to be obtained for a minimal increase in cost. In some embodiments, surfaces 22 and 24 may be covered with an anti-reflective (AR) coating to further increase transmission and minimize the possibility of backward-directed rays interfering with transmission from light-emitting array 12.

Figure 6:
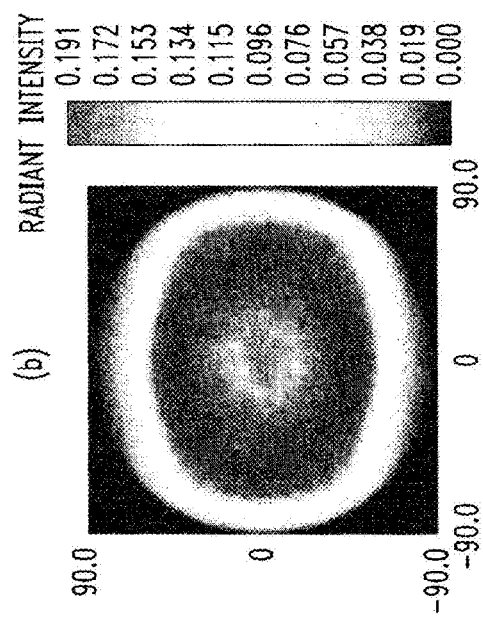
FIG. 6 illustrates the increase in FOI in the form of depicting the increase radial intensity, where
Figure 7:
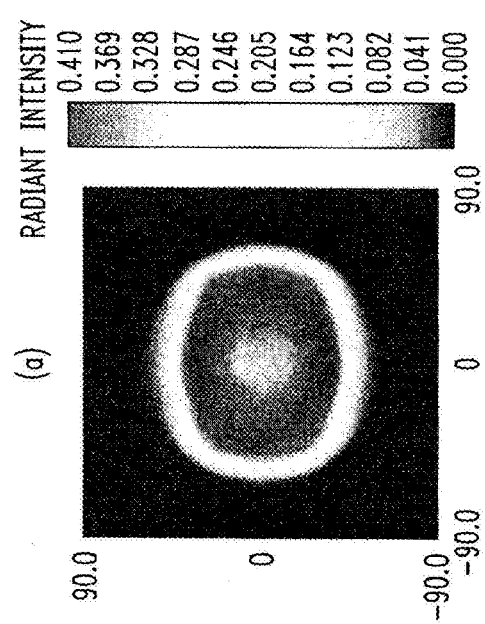
FIG. 7 contains plots associated with the data shown in FIG. 6, where FIG. 7(a) plots the increase in FOI in the vertical direction and FIG. 7(b) plots in the increase in FOI in the horizontal direction.
Figure 7:
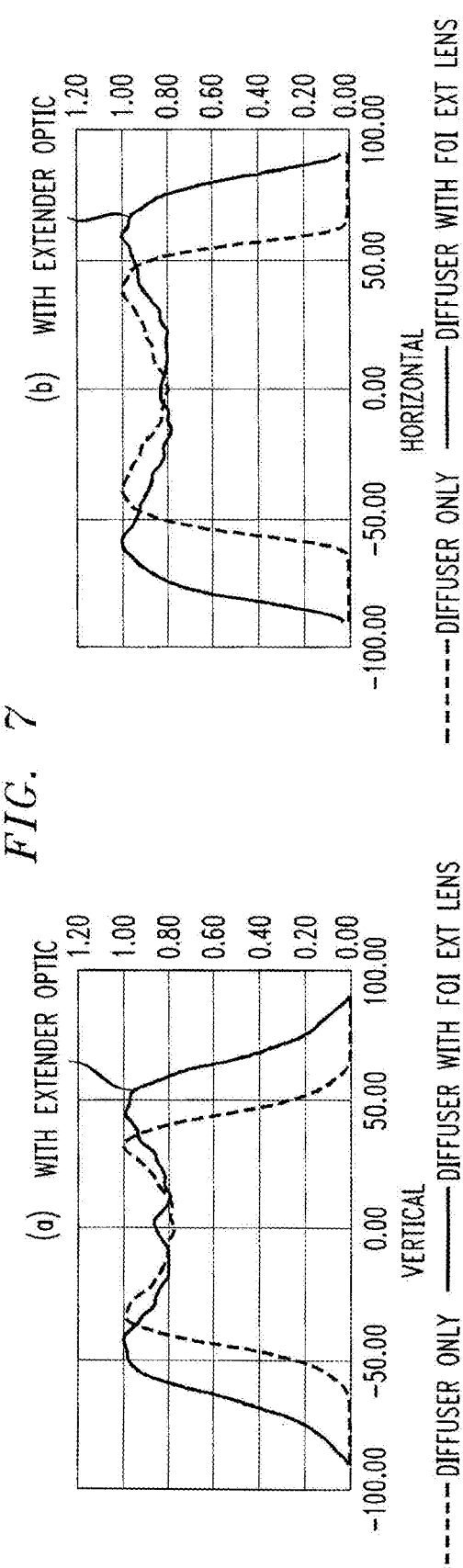

FIG. 6 shows the increase in FOI when using the extender optic of the present invention, where FIG. 6($a$) is a diagram of radial intensity for a prior art arrangement (such as that of FIG. 1) and FIG. 6($b$) is a diagram of radial intensity for a flood illuminator including the extender optic. The FOI is shown to increase from about 110°×90° to about 165°×135°. FIG. 7 contains plots of the data associated with the diagrams of FIG. 6, where FIG. 7($a$) shows the improvement in FOI across the vertical direction and FIG. 7($b$) shows the improvement in FOI across the horizontal direction. "Vertical" and "horizontal" are associated with similar axes of the original 2D VCSEL array.

While the above-described embodiment is shown as using an array of light emitting devices (particularly, VCSELs), the extended FOI illuminator of the present invention may also be used in combination with a single emitting device, such as a single semiconductor laser diode (edge-emitting or VCSEL) or a fiber-based laser source. A plurality of edge-emitting laser diodes may also be used to form an "array" of light emitting devices in the inventive extended FOI light source; for example, a 1×N edge-emitting devices may be formed in laser bar form and used as the light source. Each of these various alternatives may have a preference for a particular application.

In the foregoing detailed description, the principles of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive; accordingly, the subject matter of the present invention should be construed as limited only by the metes and bounds of the appended claims.

What is claimed is:

1. A wide field of illumination (FOI) light source comprising:
    a laser source for generating an initial light beam;
    a diffuser element disposed over the laser source for refracting the initial light beam and providing as an output a shaped light beam with an expanded FOI; and
    an extender optic disposed over the diffuser element, the extender optic having an interior curved surface for receiving the shaped light beam produced by the diffuser element and an exterior curved surface for further refracting the shaped light beam, creating as an output a light beam with an FOI wider than the expanded FOI provided by the diffuser element, wherein both the interior curved surface and the exterior curved surface of the extender optic are cylindrical in form, increasing the FOI along a single axis.

2. A wide FOI light source as defined in claim 1 wherein the extender optic is formed of a transparent glass material.

3. A wide FOI light source as defined in claim 1 wherein the extender optic is formed of an optical material that is transparent in the range of operating wavelengths associated with the laser source.

4. A wide FOI light source as defined in claim 1 wherein the extender optic further comprises an AR coating across the exterior curved surface.

5. A wide FOI light source as defined in claim 1 wherein the extender optic is configured to provide an FOI of at least 120°.

6. A wide FOI light source as defined in claim 1 wherein the extender optic is configured to provide an FOI in the range of 120-185°.

7. A wide FOI light source as defined in claim 1 wherein the extender optic is configured to provide an extended FOI in the range of 120-185° along a first axial direction, with the expanded FOI provided by the diffuser element in a second, orthogonal axial direction remaining unchanged.

8. A wide FOI light source as defined in claim 1 wherein the extender optic is formed of an optical plastic material that is transparent at an operating wavelength of the laser source.

9. A wide FOI light source as defined in claim 8 wherein the extender optic is formed of a molded optical plastic material.

10. A wide FOI light source as defined in claim 1 wherein the extender optic further comprises an AR coating across the interior curved surface.

11. A wide FOI light source as defined in claim 10 wherein the extender optic further comprises an AR coating across the exterior curved surface.

12. A wide FOI light source as defined in claim 1 wherein the laser source comprises a single lasing device.

13. A wide FOI light source as defined in claim 12 wherein the single laser device is selected from the group consisting of: a VCSEL device, an edge-emitting device, and a fiber-based device.

14. A wide FOI light source as defined in claim 1 wherein the laser source comprises a plurality of light emitting devices.

15. A wide FOI light source as defined in claim 14 wherein the plurality of light emitting devices comprises a plurality of vertical cavity surface-emitting lasers (VCSELs).

16. A wide FOI light source as defined in claim 14 wherein the plurality of light emitting devices comprises a plurality of edge-emitting lasers.

17. A wide FOI light source as defined in claim 14 wherein the plurality of light emitting devices is configured as a one-dimensional array.

18. A wide FOI light source as defined in claim 14 wherein the plurality of light emitting devices is configured as a two-dimensional array.

\* \* \* \* \*